United States Patent
Camargo Soto

(10) Patent No.: US 12,308,341 B2
(45) Date of Patent: May 20, 2025

(54) WIRE BOND CAPILLARY DESIGN

(71) Applicant: SKYWORKS SOLUTIONS, INC., Irvine, CA (US)

(72) Inventor: Miguel Camargo Soto, Mexicali (MX)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 417 days.

(21) Appl. No.: 17/066,153

(22) Filed: Oct. 8, 2020

(65) Prior Publication Data

US 2021/0111146 A1 Apr. 15, 2021

Related U.S. Application Data

(60) Provisional application No. 62/913,534, filed on Oct. 10, 2019.

(51) Int. Cl.
*H01L 23/00* (2006.01)
*B23K 20/00* (2006.01)

(52) U.S. Cl.
CPC .............. *H01L 24/78* (2013.01); *H01L 24/45* (2013.01); *H01L 24/48* (2013.01); *H01L 24/85* (2013.01); *H01L 2224/45147* (2013.01); *H01L 2224/45164* (2013.01); *H01L 2224/48465* (2013.01); *H01L 2224/7855* (2013.01); *H01L 2224/85035* (2013.01); *H01L 2224/85203* (2013.01); *H01L 2224/85207* (2013.01); *H01L 2224/85947* (2013.01)

(58) Field of Classification Search
None
See application file for complete search history.

(56) References Cited

U.S. PATENT DOCUMENTS

| | | | | |
|---|---|---|---|---|
| 3,934,783 A | * | 1/1976 | Larrison | H01L 24/48 228/110.1 |
| 4,415,115 A | * | 11/1983 | James | H01L 24/85 228/180.5 |
| 4,776,509 A | * | 10/1988 | Pitts | H01L 24/78 228/179.1 |
| 4,778,097 A | * | 10/1988 | Hauser | B23K 20/106 228/1.1 |
| 4,974,767 A | * | 12/1990 | Alfaro | B23K 20/007 228/4.5 |
| 5,485,949 A | * | 1/1996 | Tomura | B23K 20/007 257/E21.511 |
| 5,816,472 A | * | 10/1998 | Linn | B23K 20/004 228/1.1 |
| 7,216,794 B2 | * | 5/2007 | Lange | B23K 20/005 228/180.1 |
| 7,249,702 B2 | * | 7/2007 | Mironescu | B23K 20/007 228/180.5 |
| 7,407,080 B2 | * | 8/2008 | Lee | B23K 20/007 228/4.5 |
| 7,427,009 B2 | * | 9/2008 | Lim | H01L 24/78 228/110.1 |
| 8,820,609 B2 | * | 9/2014 | Walker | B23K 20/004 228/1.1 |

(Continued)

*Primary Examiner* — Devang R Patel
(74) *Attorney, Agent, or Firm* — Lando & Anastasi, LLP

(57) ABSTRACT

A capillary for performing ball bonding includes a body defining a lumen, a first blade defined in a lower tip of the body, and a second blade defined in the lower tip of the body for increasing reliability of a ball bonding procedure performed using the capillary.

19 Claims, 13 Drawing Sheets

(56) References Cited

U.S. PATENT DOCUMENTS

2004/0242401 A1* 12/2004 Zhang ................ C04B 35/4885
  501/103
2019/0088616 A1* 3/2019 Sugiyama ............... H01L 24/85

* cited by examiner

WIRE BOND CAPILLARY DESIGN

CROSS-REFERENCE TO RELATED APPLICATIONS

This application claims priority under 35 U.S.C. § 119(e) to U.S. Provisional Patent Application Ser. No. 62/913,534, titled CUPD WIRE BOND CAPILLARY DESIGN, filed Oct. 10, 2019, which is incorporated by reference herein in its entirety.

BACKGROUND

Microchips including electronic circuitry formed on semiconductor die are ubiquitous in modern electronic devices. In many instances electronic circuitry may be formed on semiconductor die having a surface area of 1 $cm^2$ or smaller. Electrical connections to the circuitry on the die are often in the form of small bond pads formed of a metal, for example, copper, aluminum, or gold. These bond pads are typically too small, for example, less than 100 μm across or smaller, to easily directly connect to a printed circuit board or other components of an electronic device. Accordingly, semiconductor die are often mounted in packages having pins, external bond pads, solder bumps, or other external electrical connections that are large enough to reliably place and connect to external components. Electrical connection between the small bond pads on the semiconductor die and the external electrical connections of the package for the semiconductor die provide for electrical communication between external components and the circuitry on the semiconductor die. Electrical connection between the bond pads and the external electrical connections may be made through internal electrical contacts on a lead frame of the package. The internal electrical contacts may be in the form of metal bond pads on the package lead frame. The electrical connections between the bond pads and the external electrical connections may be made in accordance with a number of methods, one of which is referred to as ball bonding.

SUMMARY

In accordance with one aspect, there is provided a capillary for performing ball bonding. The capillary comprises a body defining a lumen, a first blade defined in a lower tip of the body, and a second blade defined in the lower tip of the body for increasing reliability of a ball bonding procedure performed using the capillary.

In some embodiments, the first blade and the second blade are both substantially circular. The first blade and the second blade may circumscribe an opening in the lumen in the lower tip of the body. The first blade and the second blade may be concentric.

In some embodiments, the first blade is disposed at a lowermost extent of the lower tip of the body. The second blade may be disposed on a wall of the body at a position separated from the lowermost extent of the lower tip of the body. The second blade may be disposed above and outside of the first blade. The second blade may circumscribe the first blade.

In some embodiments, the first and second blades are formed integral with the body.

In some embodiments, each of the body, the first blade, and the second blade are formed of one of a mixture of alumina and zirconia or a mixture of aluminum, zirconia, and ruby.

In some embodiments, the capillary further comprises an indentation having a pyramid shaped cross-section defined in the lower tip of the body between the first blade and the second blade. The indentation may circumscribe the first blade.

In accordance with another aspect, there is provided a method of forming an electrical connection between a bond pad of a semiconductor die and an electrical contact of a package for the semiconductor die. The method comprises bonding a first portion of a bond wire to the bond pad of the semiconductor die with a capillary. The capillary includes a body defining a lumen, a first blade defined in a lower tip of the body, and a second blade defined in the lower tip of the body for increasing reliability of a ball bonding procedure performed using the capillary. The method further comprises bonding a second portion of the bond wire to the electrical contact of the package with the capillary, at least partially cutting the bond wire at a first location in the second portion with the first blade, and weakening the bond wire at a second location in the second portion with the second blade.

In some embodiments, the method further comprises applying sufficient tension to additional bond wire disposed in the lumen of the capillary and connected to the second portion of the bond wire to cause the bond wire to break at one of the first location or the second location and separate the second portion of the bond wire from the additional bond wire.

In some embodiments, forming the electrical connection between the bond pad of the semiconductor die and the electrical contact of the package includes electrically connecting a wire formed of one of copper or a copper-palladium alloy between the bond pad and electrical contact.

In some embodiments, bonding the first portion of the bond wire to the bond pad of the semiconductor die includes melting an end of the bond wire by applying electrical energy to the end of the bond wire prior to placing the end of the bond wire in contact with the bond pad of the semiconductor die.

In some embodiments, bonding the first portion of the bond wire to the bond pad of the semiconductor die includes applying one or more of heat, pressure, or ultrasonic energy to the first portion of the bond wire while the bond wire is in contact with the bond pad of the semiconductor die.

In some embodiments, at least partially cutting the bond wire at the first location in the second portion with the first blade includes fully cutting the bond wire at the first location in the second portion with the first blade.

In some embodiments, weakening the bond wire at the second location in the second portion with the second blade includes at least partially cutting the bond wire at the second location in the second portion with the second blade.

In some embodiments, the method further comprises holding the first portion of the bond wire in place on the bond pad of the semiconductor die while at least partially cutting the bond wire at the first location in the second portion with the first blade.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1A:
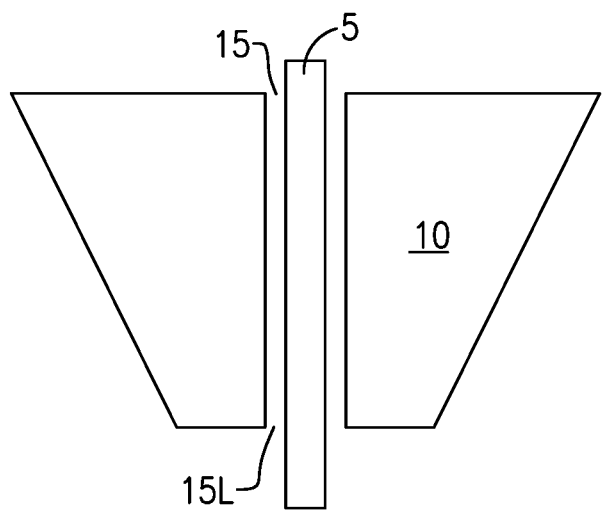
FIG. 1A illustrates an act in a wire bonding process.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Methods of forming electrical connections between a bond pad of a semiconductor die and an internal electrical contact of a package for the semiconductor die, for example, a bond pad on a lead frame of the package, may involve bonding a first end of a thin (for example, as small as 15 μm in diameter) wire to the bond pad of the semiconductor die and a second end of the wire to the internal electrical contact of the package. The internal electrical connection of the package may be electrically connected to an external electrical contact of the package by, for example, conductive traces formed in the package or additional conductive wire. Bonding the ends of the wire to the bond pad of the semiconductor die and to the internal electrical contact of the package may involve applying heat, pressure, and/or ultrasonic energy to the ends of the wire when in contact with the bond pad or electrical contact.

A method of forming an electrical connection between a bond pad of a semiconductor die and an internal contact of a package for the die by ball bonding is illustrated in FIGS. 1A-1I. In these figures the components involved are shown only in part and in a simplified manner. In a first act, illustrated in FIG. 1A, a wire 5 to be used to form the electrical connection between the semiconductor die bond pad and internal package contact is extended through a capillary 10. Capillaries used in ball bond processes are often rod-like structures including an internal lumen 15 through which the wire may pass. The lumen 15 may have a diameter greater than the wire to allow the wire to easily pass through. The capillary 10 may be formed of a non-conductive material such as a ceramic. Examples of materials of which the capillary may be formed include mixtures of alumina and zirconia ($Al_2O_3+ZrO_2$) or mixtures of alumina, zirconia, and ruby ($Al_2O_3+ZrO_2+Cr_2O_3$).

Figure 1B:
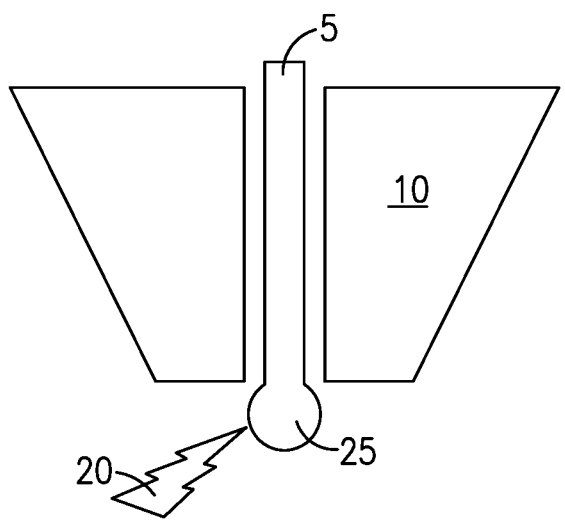
FIG. 1B illustrates another act in a wire bonding process.

The wire 5 is passed through the capillary 10 until a portion of the wire 5 extends from the lower end 15L of the lumen 15 of the capillary 10. An electrical spark 20 or current from, for example, an external electrode (not shown) is applied to the portion of the wire 5 extending from the lower end 15L of the lumen 15 of the capillary 10. The electrical spark 20 or current melts the portion of the wire 5 which subsequently re-solidifies into a ball-shaped portion of metal 25 under the influence of surface tension of the meted portion of wire 5. (FIG. 1B.)

Figure 1C:
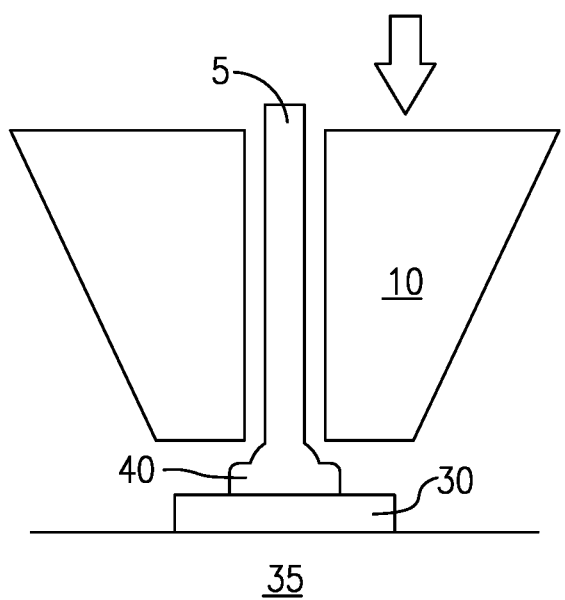
FIG. 1C illustrates another act in a wire bonding process.

Next, as illustrated in FIG. 1C, the capillary 10 and metal ball 25 are brought down and into contact with a bond pad 30 of a semiconductor die 35. Pressure, ultrasonic energy, and/or heat are applied to the bond pad 30 and metal ball 25 so that the metal ball 25 forms a bond 40 with the bond pad 30.

Figure 1D:
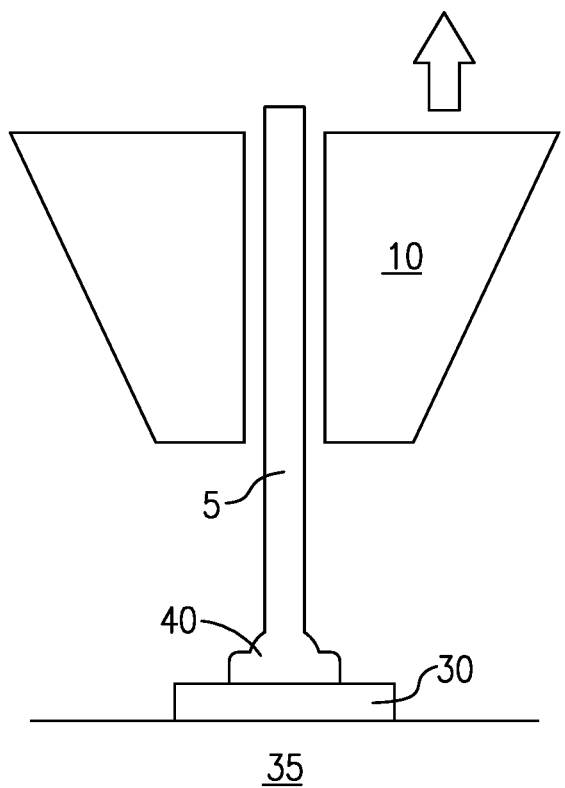
FIG. 1D illustrates another act in a wire bonding process.
Figure 1E:
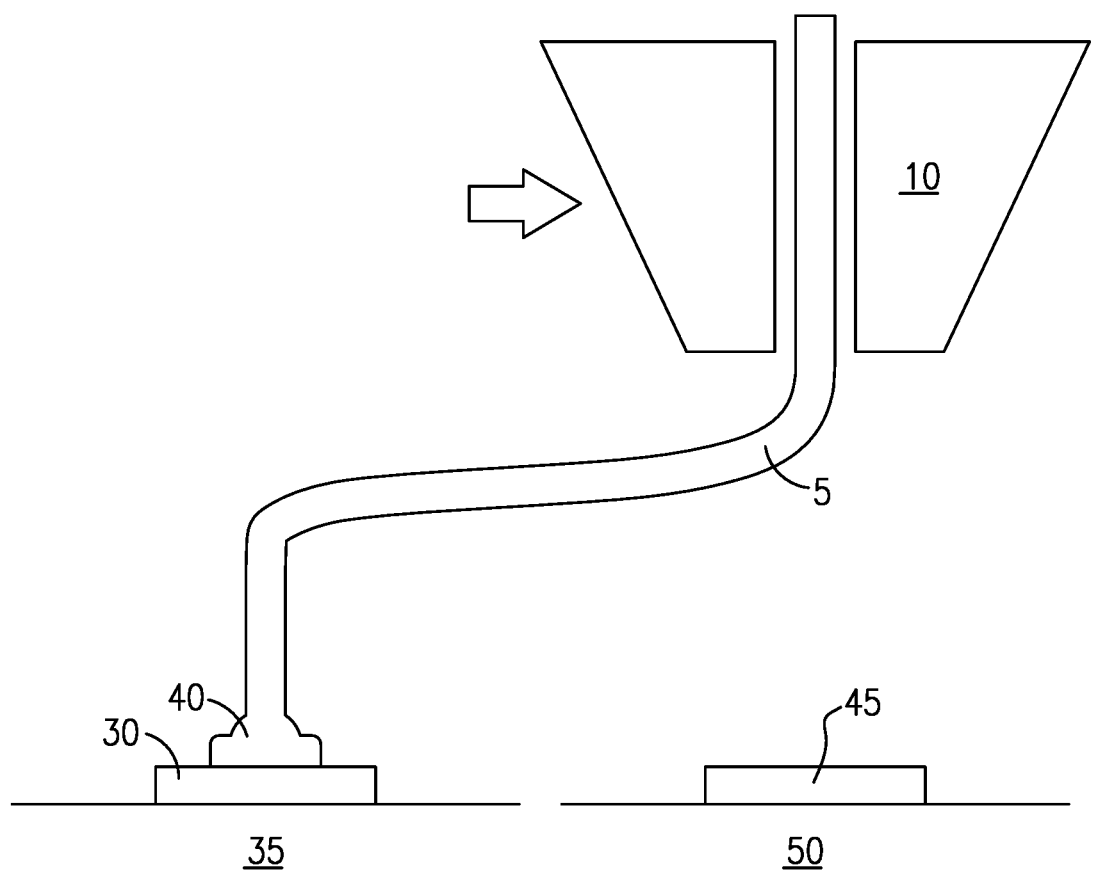
FIG. 1E illustrates another act in a wire bonding process.

The capillary 10 is lifted from the bond pad 30 and additional wire 5 is drawn through the lumen 15 of the capillary. (FIG. 1D.) The capillary 10 is then displaced laterally with additional wire 5 being drawn through the lumen 15 of the capillary, until it is over an internal electrical contact 45 of a package 50 for the semiconductor die 35. (FIG. 1E.)

Figure 1F:
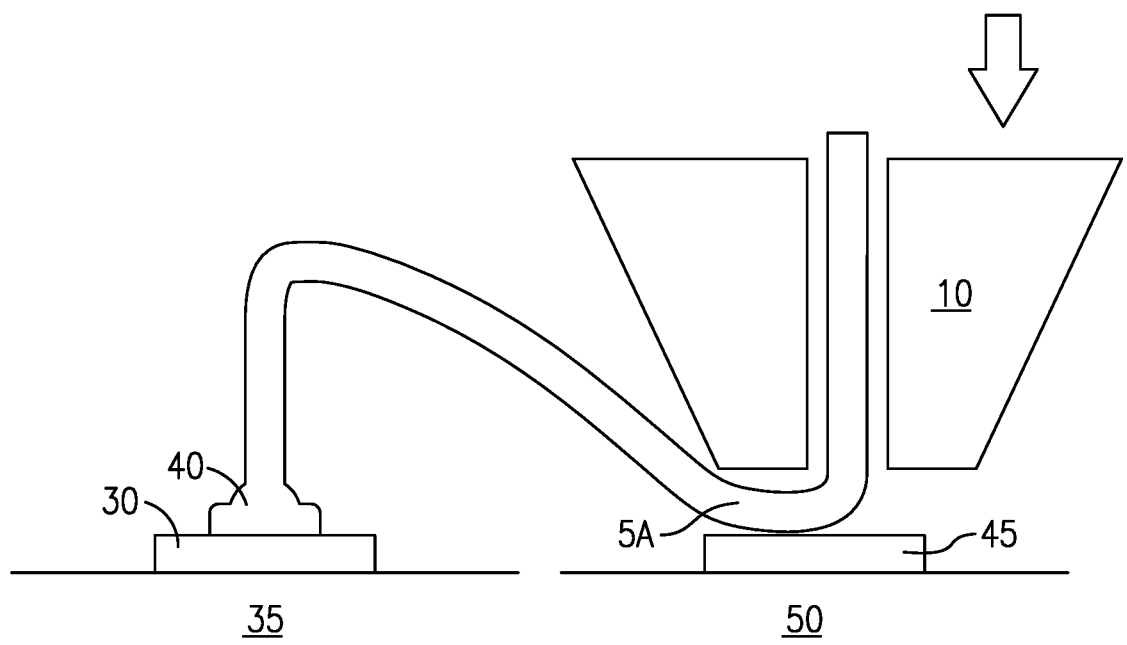
FIG. 1F illustrates another act in a wire bonding process.
Figure 1G:
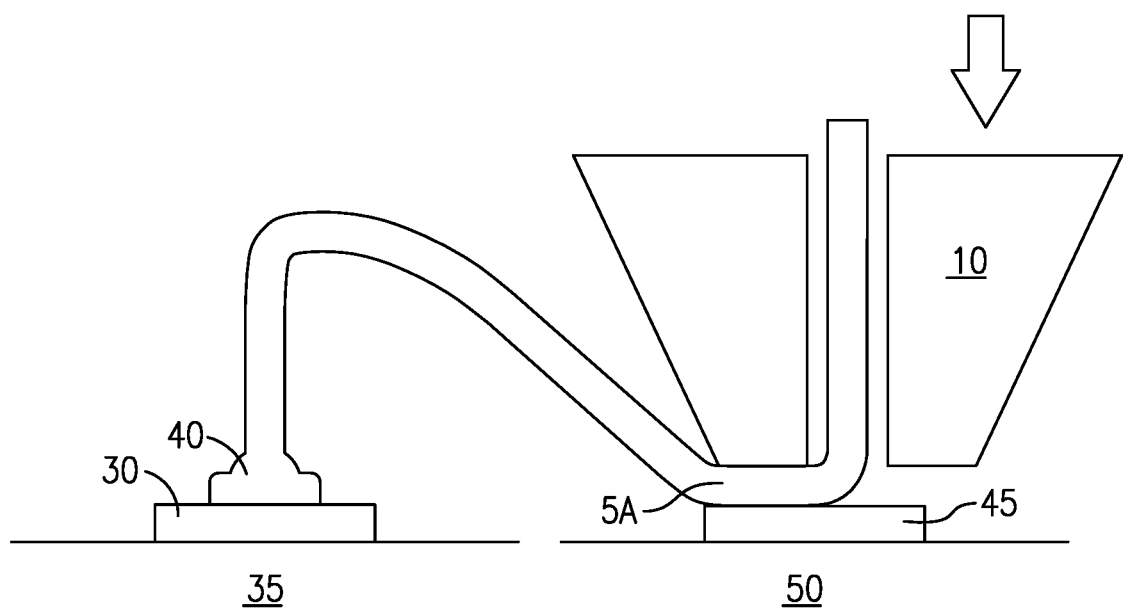
FIG. 1G illustrates another act in a wire bonding process.

The capillary 10 is lowered onto the internal electrical contact 45, trapping a portion of the wire 5A between the lower end of the capillary 10 and the internal electrical contact 45. (FIG. 1F.) Pressure, ultrasonic energy, and/or heat are applied to the internal electrical contact 45 and portion of wire 5A to bond the portion of wire 5A to the internal electrical contact 45. (FIG. 1G.) During this time, a blade disposed on the lower end of the capillary 10 cuts into an end of the portion of wire 5A proximate the lower end 15L of the lumen 15 of the capillary 10. The blade is not illustrated in FIGS. 1A-1I for clarity but is discussed in further detail below.

Figure 1H:
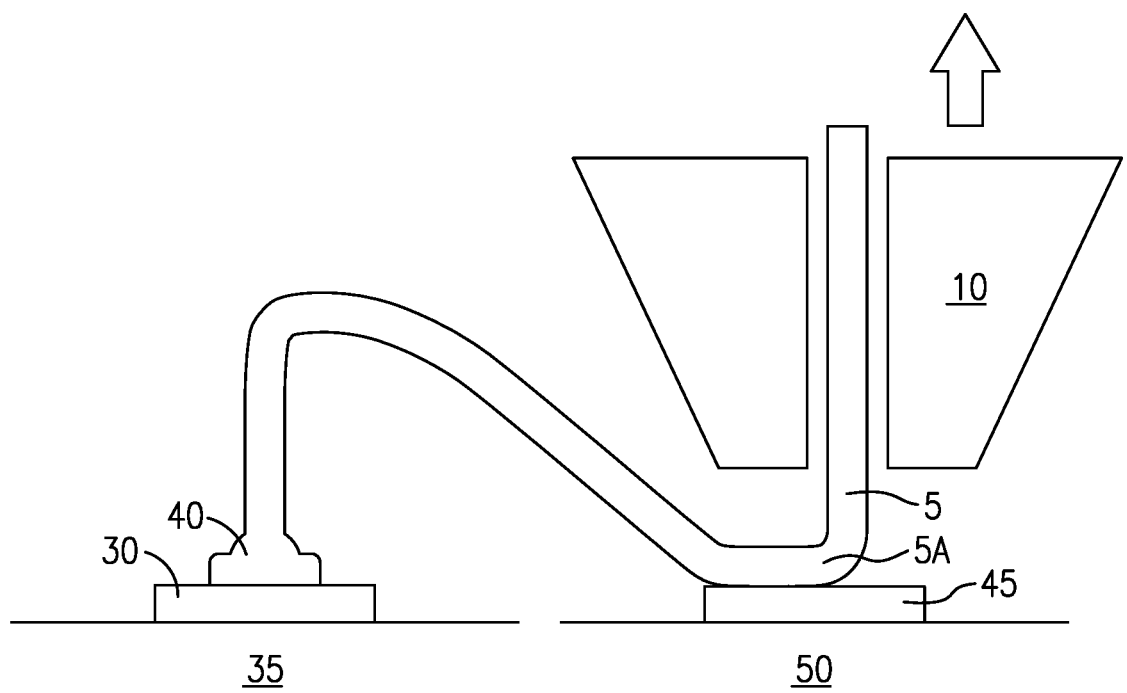
FIG. 1H illustrates another act in a wire bonding process.
Figure 1I:
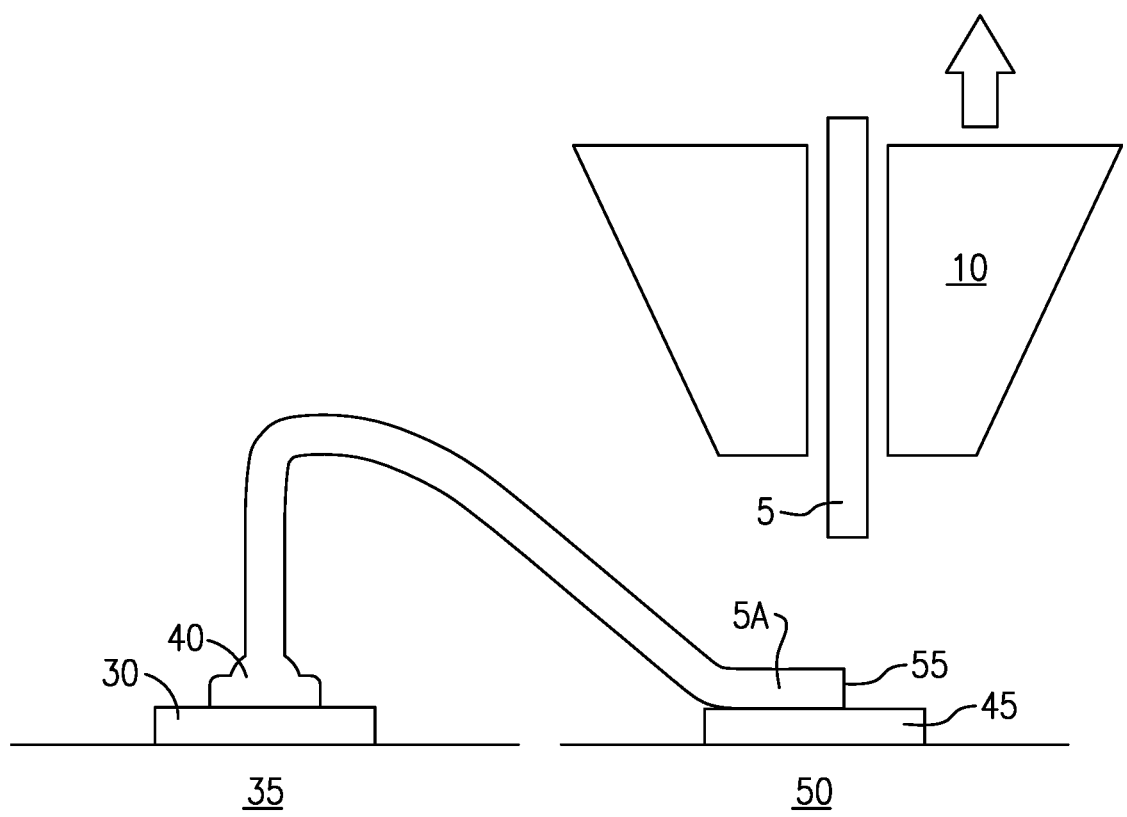
FIG. 1I illustrates another act in a wire bonding process.

After the portion of wire 5A is bonded to the internal electrical contact 40 the capillary is lifted from the internal electrical contact 45 and additional wire 5 is drawn through the lumen 15 of the capillary 10. (FIG. 1H.) The capillary 10 is lifted further without allowing additional wire 5 to pass through the lumen 15 which pulls on the portion of wire 5A bonded to the internal electrical contact 45 and separates the wire 5 extending from the lumen 15 from the portion of wire 5A bonded to the internal electrical contact 45 at the cut 55 formed by the blade during the act of bonding the portion of wire 5A to the internal electrical contact 45. (FIG. 1I.) The capillary 10 may then be moved to a new location for performing a new ball bond connection.

Figure 2:
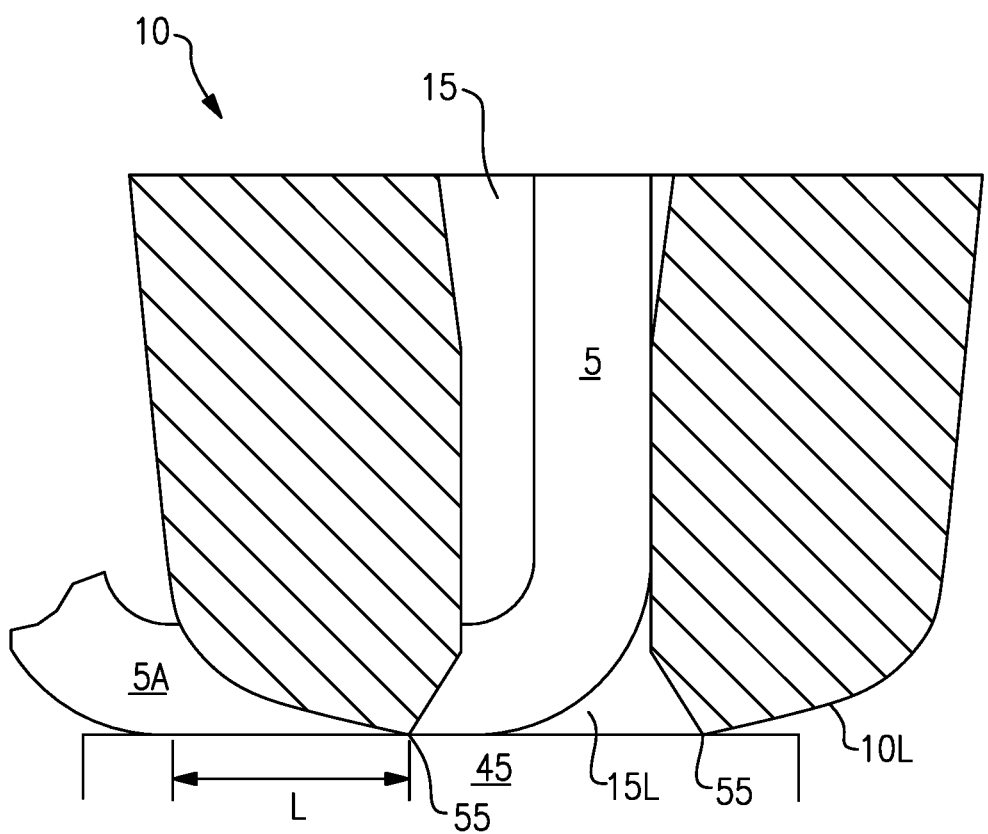
FIG. 2 illustrates a tip of an example of a capillary used in a ball bonding process.

A lower end of one example of a ball bond capillary 10 is illustrated in FIG. 2. The blade 55 that is used to cut the wire 5 during bonding of the portion of the wire 5A to the electrical contact 45 is defined by a sharp edge where an internal wall of the lower end 15L of the lumen 15 meets an outer lower surface 10L of the capillary 10. During bonding of the portion of the wire 5A to the electrical contact 45 one side of the outer lower surface 10L of the capillary 10 presses down on the portion of the wire 5A and forms a bond or weld between the portion of the wire 5A and the electrical contact 45 over a distance L. In some instances, the blade 55 cuts through an entirety of the wire 5, or at least a substantial enough portion of the wire 5, so that the portion of the wire 5A bonded to the electrical contact 45 separates from wire 5 extending from the lumen 15 as the capillary is drawn away from the electrical contact 45. The blade 55 should cut through substantial enough of the wire 5 so that the portion of the wire 5A bonded to the electrical contact 45 is not pulled off of the electrical contact 45 (a "lifted wire" defect) when it is pulled on by wire 5 extending from the lumen 15 as the capillary is drawn away from the electrical contact 45.

In the past, gold bond wires 5 were often used for ball bonding bond pads of semiconductor die to internal electrical contacts of packages for the die. The low melting temperature of gold, its high electrical conductivity, and its resistance to corrosion made gold an attractive material for such bond wires. Additionally, gold is softer than other metals often used as electrical conductors, for example, copper, which makes it easier for the blade of a ball bond capillary to cut through bonded wires and avoid lifted wire defects than if a harder metal was used for the bond wires. Gold, however, is more expensive than many other conductive metals. As a cost saving measure the industry is moving toward the use of alternative materials for ball bond wires, for example, copper or copper-palladium alloys. As noted above, these materials are harder than gold and it is more difficult for the blade of a ball bond capillary to cut through bonded wires and avoid lifted wire defects.

Figure 3:
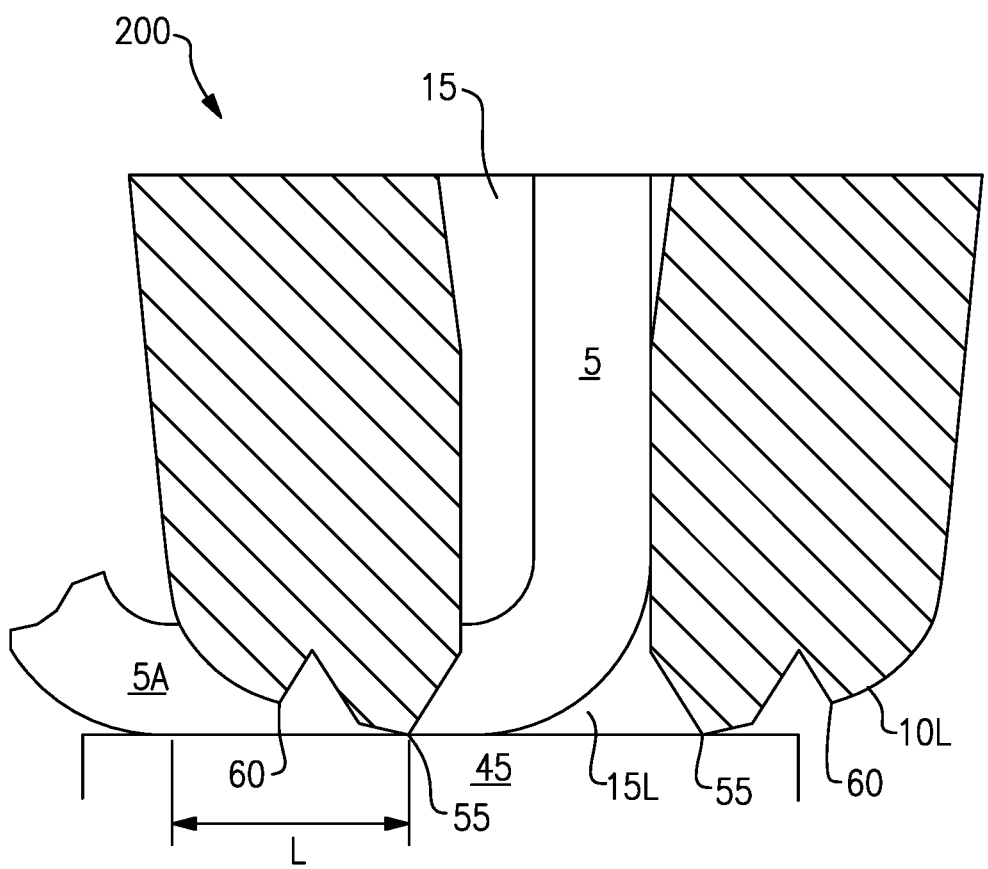
FIG. 3 illustrates a tip of another example of a capillary used in a ball bonding process.
Figure 4:
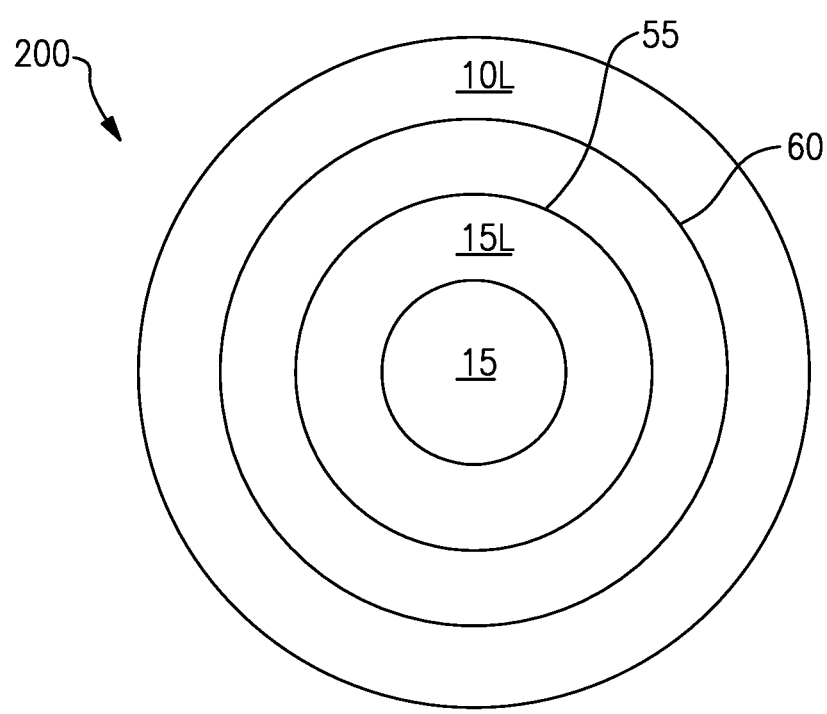
FIG. 4 is a bottom-up view of the tip of the example of a capillary of FIG. 3.

To address the problem of lifted wire defects observed with ball bond wires formed of materials that are harder than traditionally used gold wires, the tip of the ball bond capillary and in particular the blade structure of the ball bond capillary may be modified to provide more reliable wire bonding. The tip of one example of a modified ball bond capillary is illustrated in FIG. 3, indicated generally at 200. In the ball bond capillary 200, in addition to the blade 55 defined by the edge where the internal wall of the lower end 15L of the lumen 15 meets the outer lower surface 10L of the capillary, an additional blade 60 is formed on the lower surface 10L of the capillary. The additional blade 60 may circumscribe the blade 55. The additional blade 60 may be concentric with the blade 55. As illustrated in FIG. 4, which is a view from the bottom of the capillary 20, both blades 55 and 60 circumscribe and are concentric with the lumen 15 of the capillary 200. The blades 55 and 60 may be formed integral with the body of the capillary 200 as a single piece.

In use, the additional blade 60 may facilitate reliable separation of portions of wires bonded to electrical contacts from portions of wires remaining in or extending from a ball bond capillary during ball bond operation and avoidance of lifted wire defects. The additional blade 60 may, for example, help hold a portion of a wire in place while a primary blade, for example, a blade 55 as disclosed herein cuts through the portion of wire. The additional blade 60 may additionally or alternatively provide a second cut into the portion of wire at which the wire may separate if separation at a cut from a primary blade 55 fails. The additional blade 60 may additionally or alternatively create a weakened area in the wire or area of stress concentration in the wire that is predisposed to break if a separation at the cut from the primary blade 55 fails.

Figure 5:
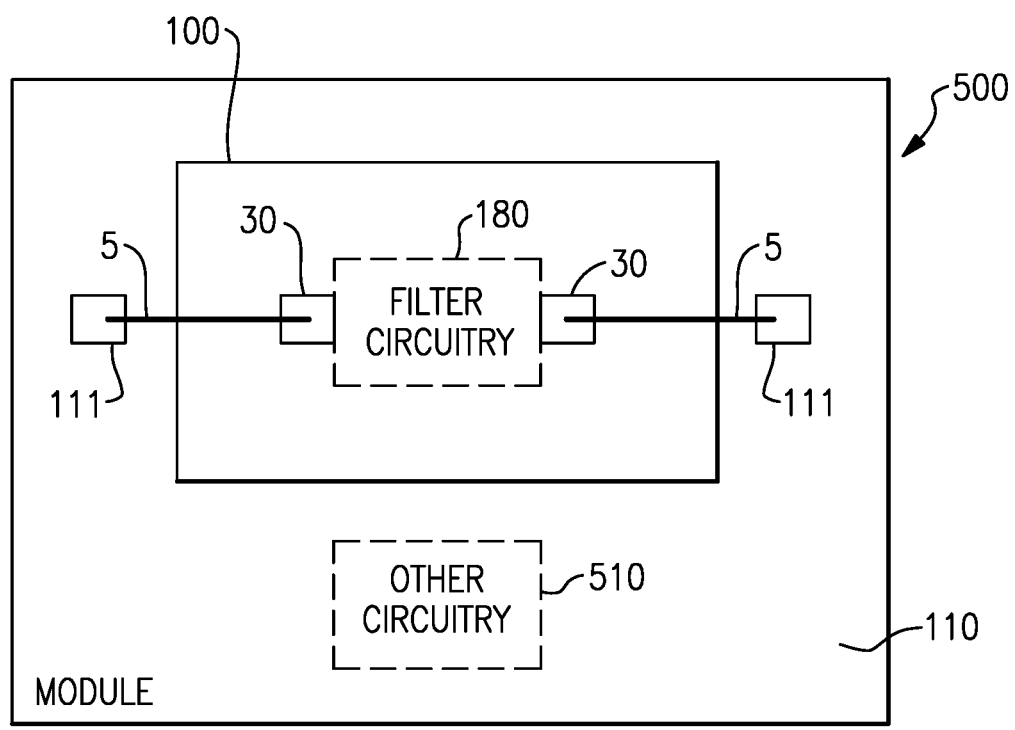
FIG. 5 is a block diagram illustrating one example of an electronic module.

Embodiments of the ball bond capillary disclosed herein may be used to form a packaged device, for example, a packaged electronic RF filter that may be included in a module that may ultimately be used in an electronic device, such as a wireless communications device, for example. FIG. 5 is a block diagram illustrating one example of a module 500 including the circuitry 180. The filter circuitry 180 may be implemented on one or more die(s) 100 including one or more connection pads 30 as illustrated in FIGS. 1A-1I. For example, the filter circuitry 180 may include a connection pad 30 that corresponds to an input contact for the filter circuitry 180 and another connection pad 30 that corresponds to an output contact for the filter circuitry 180. The packaged module 500 includes a packaging substrate 110 that is configured to receive a plurality of components, including the die 100. A plurality of connection pads 111 can be disposed on the packaging substrate 110, and the various connection pads 30 of the die 100 can be connected to the connection pads 111 on the packaging substrate 110 via electrical connectors, for example, wires 5 attached via a bump bonding technique as described herein to allow for passing of various signals to and from the filter circuitry 180. The module 500 may optionally further include other circuitry die 510, for example, one or more additional filter(s), amplifiers, pre-filters, modulators, demodulators, down converters, and the like, as would be known to one of skill in the art of semiconductor fabrication in view of the disclosure herein. In some embodiments, the module 500 can also include one or more packaging structures to, for example, provide protection and facilitate easier handling of the module 500. Such a packaging structure can include an overmold formed over the packaging substrate 110 and dimensioned to substantially encapsulate the various circuits and components thereon.

As discussed above, various examples and embodiments of the filter circuitry 180 can be used in a wide variety of electronic devices. For example, the filter circuitry 180 can be used in an antenna duplexer, which itself can be incorporated into a variety of electronic devices, such as RF front-end modules and communication devices.

Figure 6:
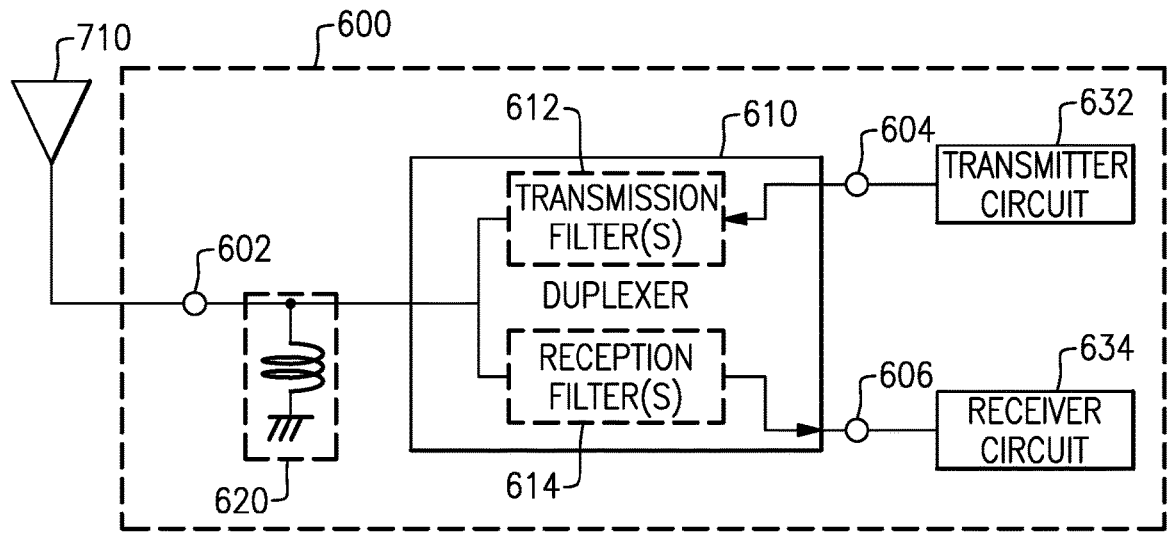
FIG. 6 is a block diagram of one example of a front-end module.

Referring to FIG. 6, there is illustrated a block diagram of one example of a front-end module 600, which may be used in an electronic device such as a wireless communications device (e.g., a mobile phone) for example. The front-end module 600 includes an antenna duplexer 610 having a common node 602, an input node 604, and an output node 606. An antenna 710 is connected to the common node 602.

The antenna duplexer 610 may include one or more transmission filters 612 connected between the input node 604 and the common node 602, and one or more reception filters 614 connected between the common node 602 and the output node 606. The passband(s) of the transmission filter (s) are different from the passband(s) of the reception filters. Embodiments of the filter circuitry 180 may be included in the one or more transmission filters 612 or the one or more reception filters 614. An inductor or other matching component 620 may be connected at the common node 602.

The front-end module 600 further includes a transmitter circuit 632 connected to the input node 604 of the duplexer 610 and a receiver circuit 634 connected to the output node 606 of the duplexer 610. The transmitter circuit 632 can generate signals for transmission via the antenna 710, and the receiver circuit 634 can receive and process signals received via the antenna 710. In some embodiments, the receiver and transmitter circuits are implemented as separate components, as shown in FIG. 6, however in other embodiments these components may be integrated into a common transceiver circuit or module. As will be appreciated by those skilled in the art, the front-end module 600 may include other components that are not illustrated in FIG. 6 including, but not limited to, switches, electromagnetic couplers, amplifiers, processors, and the like.

Figure 7:
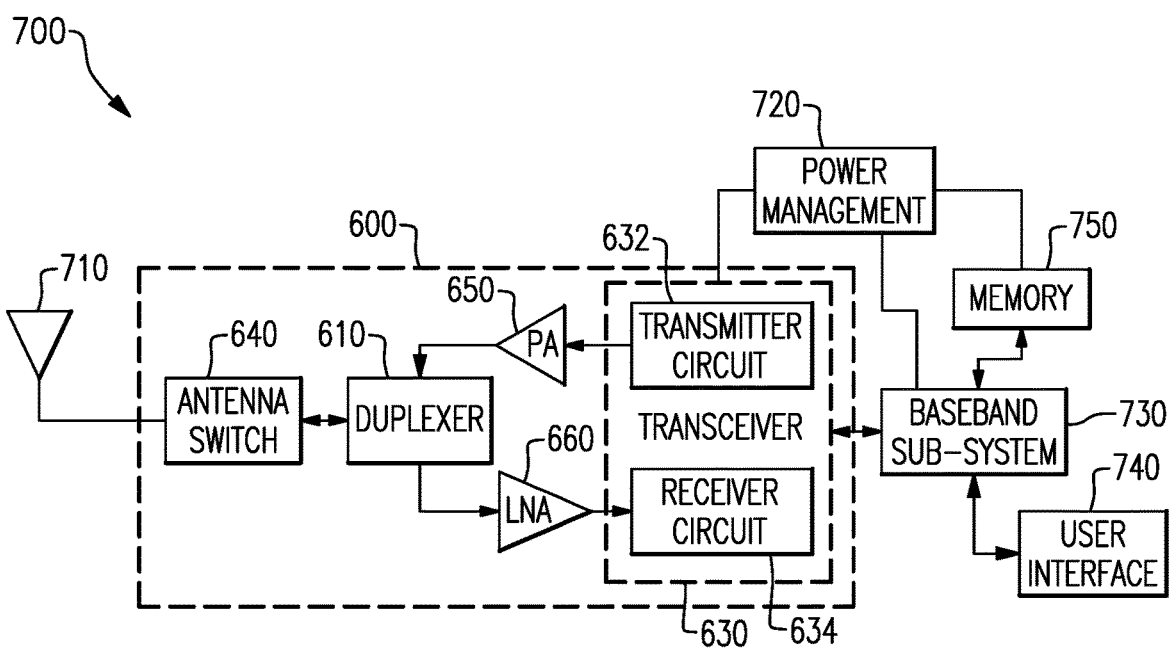
FIG. 7 is a block diagram of one example of a wireless device.

FIG. 7 is a block diagram of one example of a wireless device 700 including the antenna duplexer 610 shown in FIG. 6. The wireless device 700 can be a cellular phone, smart phone, tablet, modem, communication network or any other portable or non-portable device configured for voice or data communication. The wireless device 700 can receive and transmit signals from the antenna 710. The wireless device includes an embodiment of a front-end module 600 similar to that discussed above with reference to FIG. 6. The front-end module 600 includes the duplexer 610, as discussed above. In the example shown in FIG. 7 the front-end module 600 further includes an antenna switch 640, which can be configured to switch between different frequency bands or modes, such as transmit and receive modes, for example. In the example illustrated in FIG. 7, the antenna switch 640 is positioned between the duplexer 610 and the antenna 710; however, in other examples the duplexer 610 can be positioned between the antenna switch 640 and the antenna 710. In other examples the antenna switch 640 and the duplexer 610 can be integrated into a single component.

The front-end module 600 includes a transceiver 630 that is configured to generate signals for transmission or to process received signals. The transceiver 630 can include the transmitter circuit 632, which can be connected to the input node 604 of the duplexer 610, and the receiver circuit 634, which can be connected to the output node 606 of the duplexer 610, as shown in the example of FIG. 6.

Signals generated for transmission by the transmitter circuit 632 are received by a power amplifier (PA) module 650, which amplifies the generated signals from the transceiver 630. The power amplifier module 650 can include one or more power amplifiers. The power amplifier module 650 can be used to amplify a wide variety of RF or other frequency-band transmission signals. For example, the power amplifier module 650 can receive an enable signal that can be used to pulse the output of the power amplifier to aid in transmitting a wireless local area network (WLAN) signal or any other suitable pulsed signal. The power amplifier module 650 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 650 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 7, the front-end module 600 may further include a low noise amplifier module 660, which amplifies received signals from the antenna 710 and provides the amplified signals to the receiver circuit 634 of the transceiver 630.

The wireless device 700 of FIG. 7 further includes a power management sub-system 720 that is connected to the transceiver 630 and manages the power for the operation of the wireless device 700. The power management system 720 can also control the operation of a baseband sub-system 730 and various other components of the wireless device 700. The power management system 720 can include, or can be connected to, a battery (not shown) that supplies power for the various components of the wireless device 700. The power management system 720 can further include one or more processors or controllers that can control the transmission of signals, for example. In one embodiment, the baseband sub-system 730 is connected to a user interface 740 to facilitate various input and output of voice and/or data provided to and received from the user. The baseband sub-system 730 can also be connected to memory 750 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only, and the scope of the invention should be determined from proper construction of the appended claims, and their equivalents.

What is claimed is:

1. A capillary for performing ball bonding, the capillary comprising:
   a body defining a lumen;
   a first blade defined in a lower tip of the body;
   and a second blade defined in the lower tip of the body and laterally displaced along an outer lower surface of the lower tip from an opening of the lumen for increasing reliability of a ball bonding procedure performed using the capillary, each of the first blade and second blade having a cross-section with a lower end terminating in a downwardly directed point; and
   the capillary further comprising an indentation having a pyramid shaped cross-section defined in the lower tip of the body between the first blade and the second blade.

2. The capillary of claim 1 wherein the first blade and the second blade are both substantially circular.

3. The capillary of claim 2 wherein the first blade and the second blade circumscribe the opening of the lumen in the lower tip of the body.

4. The capillary of claim 3 wherein the first blade and the second blade are concentric.

5. The capillary of claim 1 wherein the first blade is disposed at a lowermost extent of the lower tip of the body.

6. The capillary of claim 5 wherein the second blade is disposed on a wall of the body at a position separated from the lowermost extent of the lower tip of the body.

7. The capillary of claim 6 wherein the second blade is disposed above and outside of the first blade.

8. The capillary of claim 7 wherein the second blade circumscribes the first blade.

9. The capillary of claim 1 wherein the first and second blades are formed integral with the body.

10. The capillary of claim 1 wherein each of the body, the first blade, and the second blade are formed of one of a mixture of alumina and zirconia or a mixture of alumina, zirconia, and ruby.

11. The capillary of claim 1 wherein the indentation circumscribes the first blade.

12. The capillary of claim 1 wherein each of the body, the first blade, and the second blade are formed of a non-conductive material.

13. The capillary of claim 12 wherein each of the body, the first blade, and the second blade are formed of a ceramic.

14. The capillary of claim 1 wherein the capillary has a rod-like structure.

15. The capillary of claim 1 wherein the lumen is configured to direct a bond wire through the body.

16. The capillary of claim 15 wherein the capillary is configured to hold a portion of the bond wire extending below a lower opening in the lumen against one of a bond pad of a semiconductor die or an electrical contact of a package for the semiconductor die while one of pressure, ultrasonic energy, or heat is applied to the portion of the bond wire and the one of the bond pad or electrical contact at an intensity sufficient to cause the portion of the bond wire to bond to the one of the bond pad or electrical contact.

17. The capillary of claim 15 wherein the capillary is configured to hold a portion of the bond wire extending below a lower opening in the lumen against one of a bond pad of a semiconductor die or an electrical contact of a package for the semiconductor die while the first blade cuts through the portion of the bond wire and the second blade holds the portion of the bond wire in place.

18. The capillary of claim 15 wherein the capillary is configured to hold a portion of the bond wire extending below a lower opening in the lumen against one of a bond pad of a semiconductor die or an electrical contact of a package for the semiconductor die while the first blade creates a first cut through the portion of the bond wire and the second blade creates a second cut in the portion of the bond wire.

19. The capillary of claim 15 wherein the capillary is configured to hold a portion of the bond wire extending below a lower opening in the lumen against one of a bond pad of a semiconductor die or an electrical contact of a package for the semiconductor die while the first blade creates a first cut through the portion of the bond wire and the second blade creates one of a weakened area or an area of stress concentration in the portion of the bond wire.

* * * * *